US012679723B2

(12) United States Patent
Torkkeli et al.

(10) Patent No.: US 12,679,723 B2
(45) Date of Patent: Jul. 14, 2026

(54) METHOD FOR STRUCTURAL LAYER FABRICATION IN MICROMECHANICAL DEVICES

(71) Applicant: Murata Manufacturing Co., Ltd., Nagaokakyo (JP)

(72) Inventors: Altti Torkkeli, Tuusula (FI); Hidetoshi Fujii, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 728 days.

(21) Appl. No.: 18/066,755

(22) Filed: Dec. 15, 2022

(65) Prior Publication Data

US 2023/0192480 A1 Jun. 22, 2023

(30) Foreign Application Priority Data

Dec. 16, 2021 (FI) ...................................... 20216289

(51) Int. Cl.
B81C 1/00 (2006.01)
B81B 3/00 (2006.01)

(52) U.S. Cl.
CPC .......... B81C 1/00968 (2013.01); B81B 3/001 (2013.01); *B81C 2201/0133* (2013.01); *B81C 2201/0178* (2013.01)

(58) Field of Classification Search
CPC .......... B81C 1/00103; B81C 1/00023–00126; B81C 1/00968; B81C 2201/0133; B81C 2201/0178; H01L 21/76202; H01L 21/76235; H01L 21/76264; H01L 21/762; H01L 21/76208; H01L 21/76213; B81B 3/001

See application file for complete search history.

(56) References Cited

U.S. PATENT DOCUMENTS

2007/0046396 A1* 3/2007 Huang .................. B06B 1/0292
333/186

FOREIGN PATENT DOCUMENTS

| EP | 0946977 B1 | 1/2002 | | |
| WO | 2006134580 A2 | 12/2006 | | |
| WO | WO-2007015218 A2 * | 2/2007 | ........... | B06B 1/0292 |
| WO | WO-2012142424 A1 * | 10/2012 | ......... | H10W 10/181 |
| WO | 2016044932 A1 | 3/2016 | | |

* cited by examiner

*Primary Examiner* — Moazzam Hossain
(74) *Attorney, Agent, or Firm* — ArentFox Schiff LLP

(57) ABSTRACT

A method for manufacturing a structural layer in a silicon wafer is provide. The silicon wafer has at least two areas vertically recessed to at least two recess depths, with the first recess depth being greater than the second recess depth. The method includes forming a silicon dioxide pattern, a mask layer and a silicon dioxide pad layer, etching the structural layer in a main LOCOS oxidation process, and removing the formed layers exposing the recessed structural layer. The manufactured structural layer has a bump structure with the recess depth smaller than the second recess depth, and the recessed area has no edge steps.

7 Claims, 3 Drawing Sheets

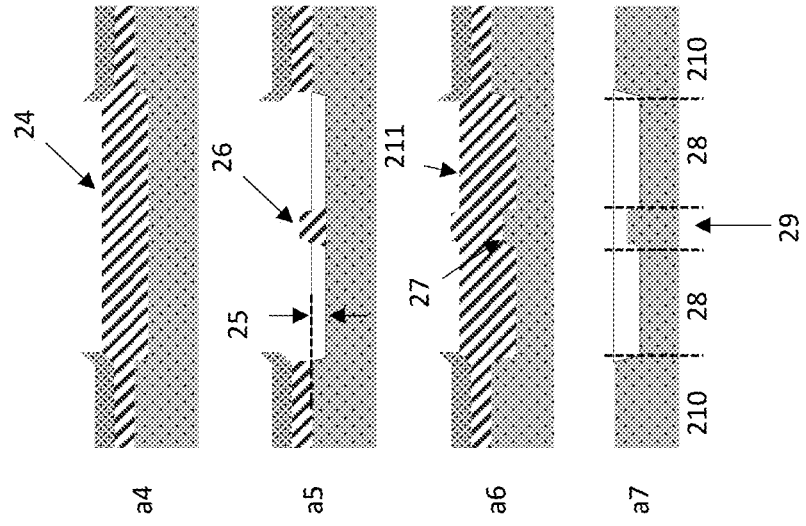
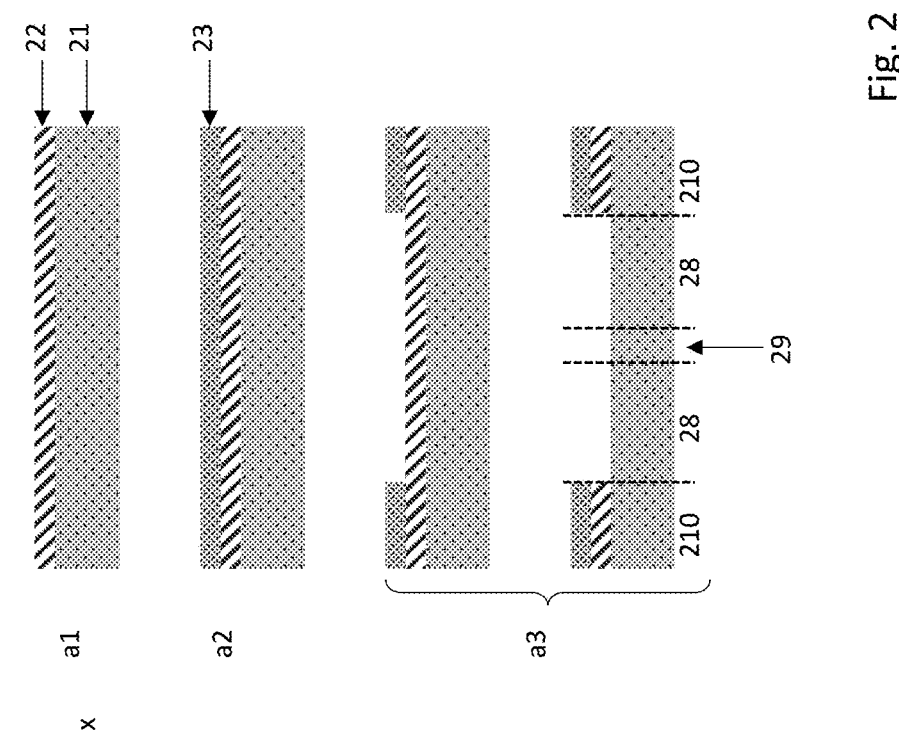
Fig. 2

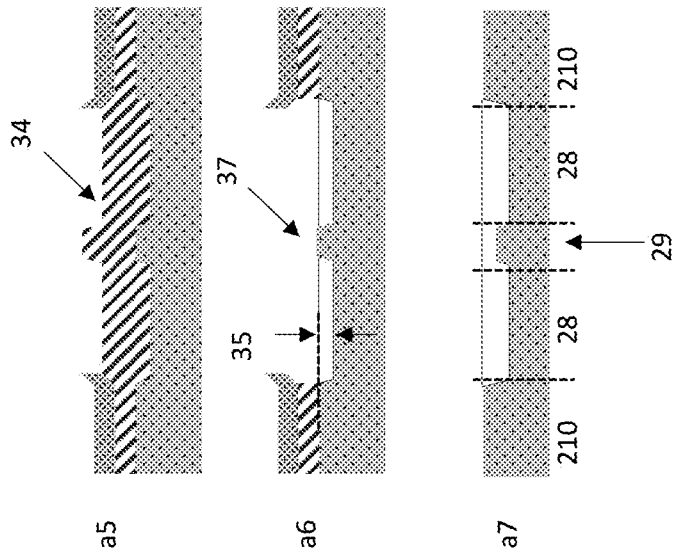
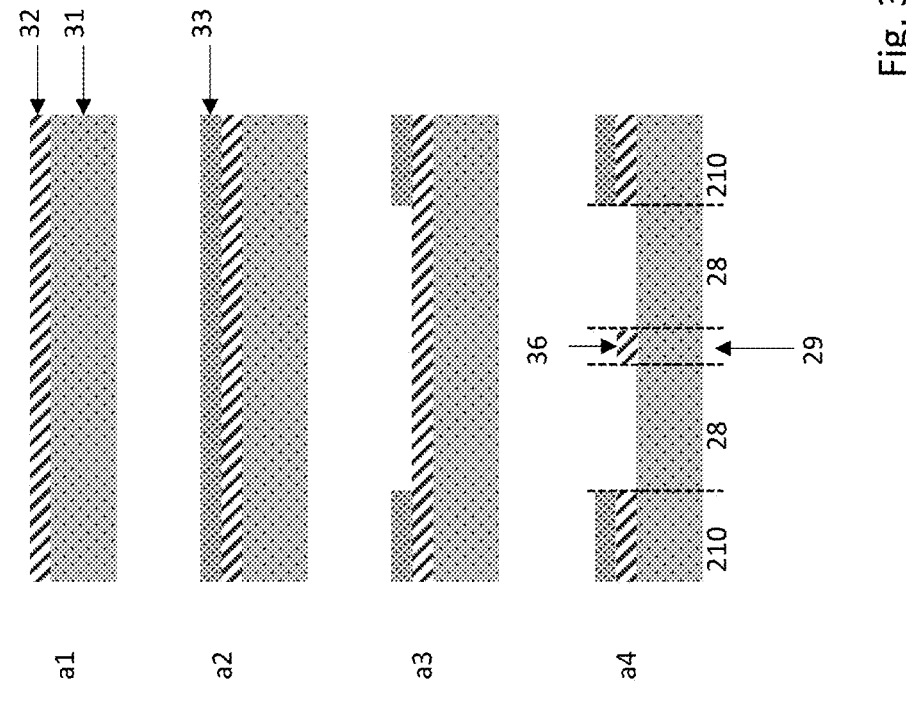
Fig. 3

1

METHOD FOR STRUCTURAL LAYER FABRICATION IN MICROMECHANICAL DEVICES

CROSS REFERENCE TO RELATED APPLICATIONS

This application claims priority to Finnish Patent Application No. 20216289, filed Dec. 16, 2021, the entire contents of which are hereby incorporated by reference in its entirety.

TECHNICAL FIELD

The present disclosure relates to the manufacturing of microelectromechanical devices, in particular to the methods of fabricating a structural layer in a wafer.

BACKGROUND

Micromechanical (MEMS) devices, such as accelerometers or gyroscopes, often comprise a structural layer in a wafer where the movable micromechanical parts are placed. The structural layer may have areas of different depths to efficiently accommodate the movable parts. Recessed areas can be fabricated in the wafer using a local oxidation process, also referred to as Local Oxidation of Silicon (LOCOS).

A LOCOS process is based on oxidation resistant thin film, typically silicon nitride, which is patterned using lithography and etching so that the silicon oxidation is locally prevented. Typically, there is a thin silicon dioxide layer between silicon wafer and silicon nitride which compensates high stress of the silicon nitride and provides etch-stop layer for patterning the silicon nitride. After thermal oxidation, the silicon nitride and silicon dioxide layers can be removed by wet etching using either hydrofluoric acid or phosphoric acid combined with oxide etchant. Because thermal oxidation consumes silicon, a recess pattern can be generated in the surface of the structural layer. Recess pattern can be alternatively made using wet or dry etching of silicon using a lithographically patterned resist mask. The number of process steps required for producing a recess pattern is greater in a LOCOS process than in a regular etching process, but the LOCOS process results in less recess depth variation which is an important benefit in MEMS devices.

Traditionally, structural layers which comprise several recess depths are manufactured using at least two LOCOS processes that require identical preparation steps repeated at least two times. For example, WO2016044932A1 describes the fabrication process of the anti-stiction bumps in a MEMS sensor using the two step LOCOS process. The two step LOCOS process allows the structural layer to be recessed to two different depths. The process described in WO2016044932A1 includes repeating the complete LOCOS process and mask removal two times, so that the number of process steps is high. Furthermore, this process produces vertical steps on the edges of the recessed area because the edges of the two local oxidations cannot be placed perfectly on top of each other. However, some margin is needed to include tolerances from lithography alignment and lateral oxidation under the silicon nitride mask. Such vertical steps are not desired in some MEMS devices since they reduce the space of the structural layer available for positioning the mobile parts.

SUMMARY OF THE INVENTION

Accordingly, an object of the present disclosure is to provide an improved manufacturing process of the structural layer that alleviates the above disadvantages by reducing the number of steps in the process and avoiding formation of edge steps.

In an exemplary aspect, a manufacturing process is provided for manufacturing a structural layer in a silicon wafer. In this aspect, the method includes forming a silicon dioxide pad layer in first, second and third areas of the structural layer in the silicon wafer; depositing a non-oxidizable mask layer in the first, the second and the third areas of the structural layer; removing the silicon dioxide pad layer and the non-oxidizable mask layer from the first area and the second area of the structural layer; consuming the structural layer in an initial LOCOS oxidation process step to form an initial LOCOS oxide layer in the first area and the second area of the structural layer; removing the initial LOCOS oxide layer from the first area of the structural layer to form a silicon dioxide pattern from the initial LOCOS oxide layer in the second area of the structural layer; and consuming the structural layer in at least one main LOCOS oxidation process step to form a main LOCOS oxide layer in the first area and the second area of the structural layer.

In another exemplary aspect, the method includes removing the silicon dioxide pad layer, the mask layer and the LOCOS oxide layer from the structural layer to expose the first area and the second area of the structural layer.

In another exemplary aspect, the first area, the second area and the third area of the structural layer are on a horizontal face of the silicon wafer. Moreover, in an exemplary aspect, the third area of the structural layer is level with the horizontal face of the wafer, and the first and the second area are recessed in a vertical direction from the horizontal face of the wafer, where the vertical direction is perpendicular to the horizontal face of the wafer.

In another exemplary aspect, the method includes etching the first area to a first recess depth in relation to the horizontal face of the wafer; and etching the second area to a second recess depth in relation to the horizontal face of the wafer, with the first recess depth being greater than the second recess depth.

In another exemplary aspect, the removing of the silicon dioxide pad layer comprises wet etching the silicon dioxide pad layer so that only the third area is protected from recession by the non-oxidizable mask layer deposited over the silicon dioxide pad layer.

According to an exemplary aspect, a manufacturing process is provided in which the at least two areas of the structural layer are recessed to at least two recess depths. The process is optimized so that the forming of the recessed areas is performed in less steps than when manufactured with repeating the traditional LOCOS process two times as described above, for example. The different recess depths are achieved by creating a silicon dioxide pattern over the to-be-recessed area on the structural layer prior to the main LOCOS process. Thus, a bump structure with a recess depth smaller than the main recess depth can be formed with only one modified LOCOS process.

According to the exemplary aspects of the manufacturing method, the manufactured structural layer does not have the steps on the edges of the recessed areas and can be fabricated in a simpler process.

BRIEF DESCRIPTION OF THE DRAWINGS

In the following, the disclosure will be described in greater detail by exemplary embodiments with reference to the accompanying drawings, in which:

FIG. 2 shows a first example of a fabrication process according to an exemplary aspect.

FIG. 3 shows a second example of a fabrication process according to an exemplary aspect.

DETAILED DESCRIPTION OF EMBODIMENTS

Figure 1:
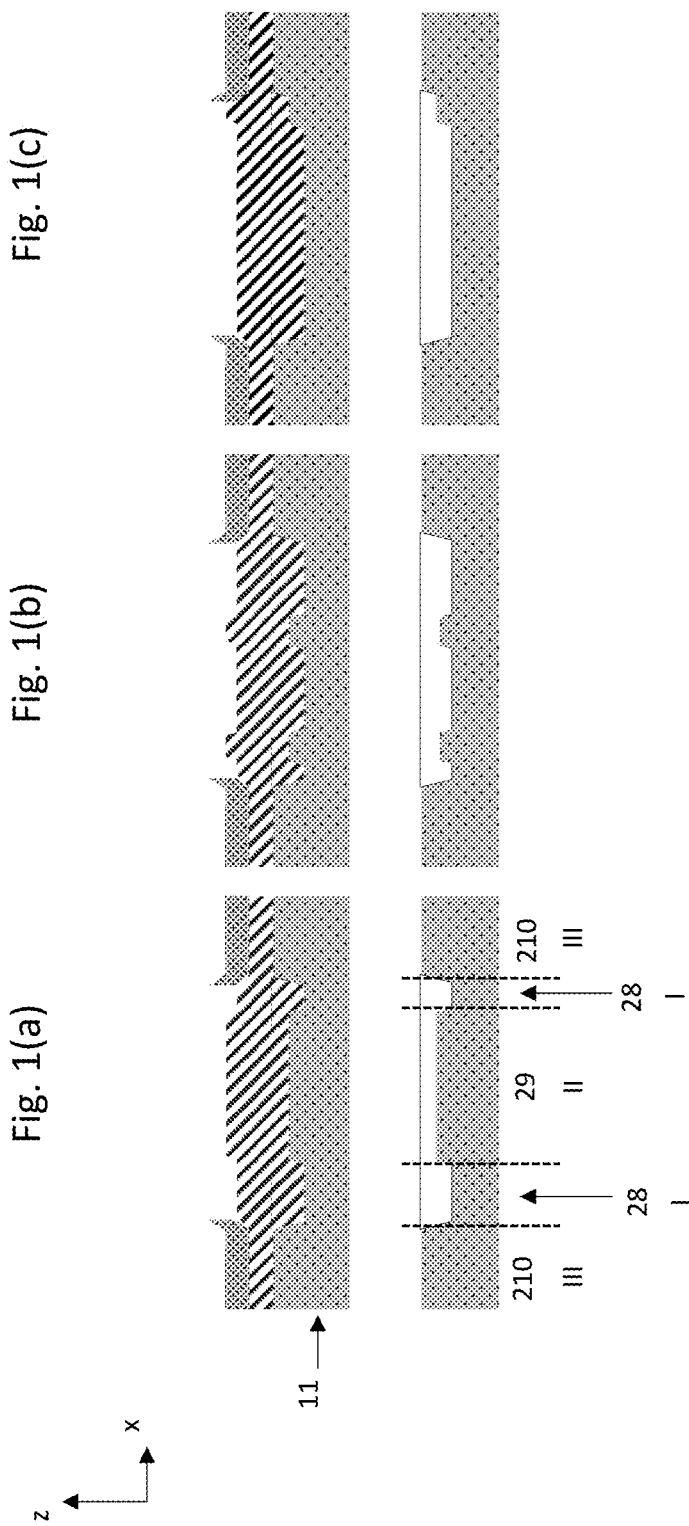
FIGS. 1(*a*) to 1(*c*) illustrate the areas of the structural layer of the wafer according to exemplary aspects.

The exemplary aspects of the present disclosure provide a method for manufacturing a structural layer in a silicon wafer. The structural layer includes a first area, a second area and a third area on a horizontal face of the wafer, wherein the third area of the structural layer is level with the horizontal face of the wafer. The first and the second areas are recessed in a vertical direction from the horizontal face of the wafer, wherein the vertical direction is perpendicular to the horizontal face of the wafer. Moreover, the first area is recessed to a first recess depth in relation to the horizontal face of the wafer, and the second area is recessed to a second recess depth in relation to the horizontal face of the wafer. The first recess depth is greater than the second recess depth.

In an exemplary aspect, the method includes forming a silicon dioxide pad layer in the third area of the structural layer, a non-oxidizable mask layer over the silicon dioxide pad layer in the third area of the structural layer, and a silicon dioxide pattern in the second area of the structural layer. Moreover, the method further includes consuming the structural layer in at least one main LOCOS process step so that a main LOCOS oxide layer is formed in the first area and the second area of the structural layer. Finally, the method includes removing the silicon dioxide pad layer, the mask layer and the LOCOS oxide layer from the structural layer, so that the first area and the second area are exposed.

According to the exemplary aspects, the structural layer is manufactured by recessing the at least two areas on the horizontal face of a silicon wafer. The structural layer is a part of the silicon wafer. Additional processing may be performed on the structural layer after or before the LOCOS process to give it the functionalities required for a particular MEMS application. Moreover, some parts of the structural may for example be partly released from the surrounding areas of the wafer so that they are movable in relation to surrounding fixed structures.

FIGS. 1(*a*) to 1(*c*) illustrate the areas of the structural layer 11, the recess depths and the positions of the recessed areas. The three areas 28, 29 and 210 of the structural layer denote regions that have different recess depths after the recess process. The recess depth is the vertical distance from the horizontal face of the wafer to the bottom of the recessed area of the structural layer. At least two recess depths are described, wherein the structural layer 11 is recessed to a deeper depth in the first area 28 than in the second area 29 in relation to the horizontal face of the wafer. The third area 210 is level with the horizontal face of the wafer and is not recessed. Moreover, a bump structure is formed in the second area of the structural layer 29. The second recess depth defines the height of the bump structure. In other words, the bump structure is a part of the structural layer in the second area 29 that has the shallower recess depth than the first area 28, but which is recessed deeper than the non-recessed third area of the structural layer 210.

FIGS. 1(*a*) to 1(*b*) illustrates example aspects of how the recessed areas can be designed. The size of the second area 29 in the horizontal plane may be larger than the size of the first area 28, as in option shown in FIG. 1(*a*). Moreover, the first area 28 can include of two or more parts, as in FIGS.

1(*a*) and 1(*b*). The second area 29 can include of two or more parts, as shown in FIG. 1(*b*) in an exemplary aspect. A part of the first area 28 may lie between each second area 29 and the third area 210, as in each of FIGS. 1(*a*), 1(*b*) and 1(*c*). The size of the second area 29 may be smaller than the size of the first area 28, as in FIG. 1(*b*) and FIG. 1(*c*). Yet in another exemplary aspect, the second (29) and the third (210) areas contact without an intervening first area, as shown in FIG. 1(*c*).

For purposes of this disclosure, the horizontal face is defined by the plane which is parallel to the top surface of the wafer. The vertical direction is defined as perpendicular to the horizontal face and illustrated with the z-axis in the figures.

In this disclosure, the two thermal oxidation processes are described. The "LOCOS oxidation process" is used to form the silicon dioxide layer over the areas not protected by the mask layer and recess the underlying silicon. The "pad oxidation process" refers to the thermal oxidation of the whole surface of the horizontal face of the silicon wafer without any layers deposited on it as the first step of the LOCOS process. The term "LOCOS process" generally refers to the full process sequence that includes pad oxidation, deposition and patterning of a mask layer and removal of all layers so that the remaining silicon surface is free of any layers. In other words, the term "LOCOS oxidation process" refers to one step in the "LOCOS process".

Moreover, for purposes of this disclosure, the term "LOCOS oxide layer" refers to an oxide layer formed during the LOCOS oxidation process. The LOCOS oxide layer forms in the areas of the structural layer not protected by the combination of the silicon dioxide pattern and the mask layer. During the same LOCOS oxidation process, the underlying silicon is consumed, or recessed. The thickness of the silicon consumed is typically about 44% of the thickness of the LOCOS oxide layer formed. Thus, the thickness of the formed LOCOS oxide layer defines the depth of the recess areas in the exemplary aspect. For example, a LOCOS oxide thickness of 2500 nm produces 1100 nm deep recess in the structural layer of a silicon wafer after the LOCOS oxide is removed.

In the following description, the term "silicon dioxide pad layer" describes the silicon dioxide layer formed in the beginning of the LOCOS process, during the thermal oxidation of the horizontal face of the wafer. The silicon dioxide pad layer is placed between the horizontal face of the wafer and a non-oxidizable mask layer and is patterned to cover the at least the third area of the structural layer. The pad layer prevents formation of silicon crystal defects from high stress of the silicon nitride mask layer and provides etch-stop layer for plasma etching of the silicon nitride.

Furthermore, the term "silicon dioxide pattern" refers to a silicon dioxide layer deposited on the structural layer of the wafer and patterned over at least the second area of the structural layer. As described in the embodiments below, the silicon dioxide layer is deposited during a process, which may be the thermal oxidation process over the entire horizontal face of the silicon wafer (forming the silicon dioxide pad layer), or the local LOCOS oxidation process (forming the LOCOS oxide layer) restricted to the areas of the structural layer not protected by the combination of the silicon dioxide pad layer and the mask layer. The patterning of the silicon dioxide layer may be done by, for example, wet etching in an exemplary aspect.

In general, the areas of the structural layer covered by the silicon dioxide pattern are consumed at a slower rate during the LOCOS oxidation process than the areas without the silicon dioxide pattern since the oxidant must diffuse through the silicon dioxide pattern and the forming LOCOS oxide layer in order to react with silicon and form silicon dioxide. The thickness of the silicon dioxide pattern defines the oxidation rate of underlying silicon. In other words, the amount of silicon consumed during a certain oxidation time depends on the thickness of the silicon dioxide pattern deposited over the surface which undergoes oxidation. Thereby, formation of two different recess depths during one LOCOS oxidation process is possible if the areas with and without the silicon dioxide pattern undergo oxidation.

The "non-oxidizable mask layer", which may also be called the mask layer, is deposited over the silicon dioxide pad layer and patterned over one area of the structural layer. The mask layer can be, for example, a 250 nm silicon nitride ($Si_3N_4$) layer deposited by LPCVD (low pressure chemical vapor deposition), and the patterning can be performed, for example, by plasma etching. Silicon nitride is industrial standard material, but any other material that does not react with oxygen or oxidizes so slowly that it is not complexly oxidized during the LOCOS process can also be used according to various exemplary aspects. The areas of the structural layer covered by the mask layer over the silicon dioxide pad layer are protected from oxidation and recessing during the LOCOS process. In this disclosure, the third area of the structural layer has the mask layer deposited over it and is not recessed.

In general, it is noted that the methods and considerations described above apply to all embodiments of this disclosure.

First Exemplary Embodiment

In a first exemplary embodiment, step (a) comprises the following sub-steps:
(a1) forming a silicon dioxide pad layer in the first, the second and the third areas of the structural layer,
(a2) depositing a non-oxidizable mask layer in the first, the second and the third areas of the structural layer,
(a3) removing the silicon dioxide pad layer and the non-oxidizable mask layer from the first and the second areas of the structural layer,
(a4) consuming the structural layer in an initial LOCOS oxidation process step so that an initial LOCOS oxide layer is formed in the first and the second areas of the structural layer,
(a5) removing the initial LOCOS oxide layer from the first area of the structural layer, so that the silicon dioxide pattern is formed from the initial LOCOS oxide layer in the second area of the structural layer.

These sub-steps of the manufacturing process are described with reference to FIG. 2. Initially, in process steps a1-a2, the silicon dioxide pad layer 22 and the mask layer 23 are deposited on the structural layer 21 over the first area 28, the second area 29 and the third area 210 of the structural layer. In process step a3, the mask layer 23 is removed from the first area 28 and second area 29 of the structural layer by, for example, lithography and plasma etching. The silicon dioxide pad layer 22 is removed from the first area 28 and second area 29 of the structural layer by, for example, wet etching, so that only the third area 210 is protected from recession by the mask layer deposited over the silicon dioxide pad layer.

In this embodiment, the initial and the main LOCOS oxidation processes are described. The initial LOCOS oxidation process is used to form an initial LOCOS oxide layer, while the main LOCOS oxidation process consumes the structural layer to the intended recess depths.

Process step a4 illustrates the initial LOCOS oxidation process wherein the structural layer is consumed and the initial LOCOS oxide layer 24 is formed in the first area 28 and the second 29 area of the structural layer. The silicon dioxide pattern will be formed from this initial LOCOS oxide layer, as described below. During the same initial LOCOS oxidation process, the first area 28 and the second area 29 of the structural layer are consumed to the initial recess depth 25.

In process step a5, the initial LOCOS oxide layer 24 is removed from the first area 28 of the structural layer so that the silicon dioxide pattern 26 is formed from the initial LOCOS oxide layer 24 in the second area 29 of the structural layer. According to an exemplary aspect, the silicon dioxide pattern 26 may be formed by lithography and wet etching the initial LOCOS oxide layer 24 in buffered hydrofluoric acid performed on the horizontal face of the structural layer. Instead of buffered hydrofluoric acid also other wet etchants or plasma processes suitable for silicon dioxide etching can be used in alternative aspects.

In process step a6, the at least one main LOCOS oxidation process is performed. The main LOCOS oxide layer 211 and the further recess depths of the first area 28 and the second area 29 of the structural layer are formed during the main LOCOS oxidation process. The thermal oxidation process proceeds at different rates in the first area 28 and the second area 29 of the structural layer. The second area of the structural layer 29, which has the silicon dioxide pattern 26 is recessed at slower rate than the first area of the structural layer. This leads to formation of the bump structure 27 in the second area of the structural layer 29 which has the recess depth smaller than the recess depth of the first area 28. The main LOCOS oxidation process may be repeated to further increase the recess depths. The main LOCOS oxide layer 211, the silicon dioxide pad layer and the mask layer are then removed from the structural layer of the wafer using, for example, 50% hydrofluoric acid in process step a7.

Second Exemplary Embodiment

In a second embodiment, step (a) comprises the following sub-steps:
(a1) forming a silicon dioxide pad layer in the first, the second and the third areas of the structural layer.
(a2) depositing a non-oxidizable mask layer in the first, the second and the third areas of the structural layer.
(a3) removing the non-oxidizable mask layer from the first and the second areas of the structural layer.
(a4) removing the silicon dioxide pad layer from the first area of the structural layer, so that the silicon dioxide pattern is formed from the silicon dioxide pad layer in the second area of the structural layer.

These sub-steps of the manufacturing process are described with reference to FIG. 3. In the process steps a1-a2, the silicon dioxide pad layer 32 and the mask layer 33 are deposited on the structural layer 31 over the first area 28, the second area 29 and the third area 210 of the structural layer. In process step a3, the mask layer 23 is removed from the first area 28 and second area 29 of the structural layer so that only the third area 210 is protected from recession during the LOCOS process. The removal of the mask layer may be done by, for example, lithography and plasma etching. In process step a4, the silicon dioxide pattern 36 is patterned from the silicon dioxide pad layer 32 in the second area of the structural layer 29. The patterning of the silicon dioxide pad layer may be done by, for example, lithography and wet etching.

In process steps a5 to a7 illustrated in FIG. 3, the at least one main LOCOS oxidation process is performed. The first LOCOS oxide 34, the initial recess depth 35 and the initial bump structure 37 in the second area of the structural layer are formed during the first main LOCOS oxidation process during process step a5. The bump structure 37 is formed due to presence of the silicon dioxide pattern 36 in the second area of the structural layer 29 that slows down the recession rate during the LOCOS oxidation process. In process step a6, the formed LOCOS oxide layer 34 is removed using, for example, buffered hydrofluoric acid. Optionally, a second main LOCOS oxidation process can be performed to etch the first area 28 and the second area 29 of the structural layer to deeper recess depths. However, only one LOCOS oxidation process step may be sufficient if the desired recess depths are achieved during the first main LOCOS oxidation process. In process step a7, the silicon dioxide pad layer and the mask layer are removed from the structural layer of the wafer using, for example, 50% hydrofluoric acid.

In general, it is noted that the primary difference between the fabrication methods described in FIG. 2 and FIG. 3 is in the formation of the silicon dioxide pattern in the second area of the structural layer that defines the recess depth. In the method described in FIG. 2, the silicon dioxide pattern is fabricated from the LOCOS oxide layer which forms in the initial LOCOS oxidation process. Thus, at least two LOCOS oxidation processes are performed in this embodiment of the disclosure. In the method showed in FIG. 3, the silicon dioxide pattern is formed from the silicon dioxide pad layer deposited directly on the horizontal face of the wafer, and only one LOCOS oxidation process may be performed in this embodiment.

In general, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

The various aspects disclosed herein encompass present and future known equivalents to the known modules referred to herein by way of illustration. Moreover, while aspects and applications have been shown and described, it would be apparent to those skilled in the art having the benefit of this disclosure that many more modifications than mentioned above are possible without departing from the inventive concepts disclosed herein.

What is claimed:

1. A method for manufacturing a structural layer in a silicon wafer, the method comprising:

forming a silicon dioxide pad layer in first, second and third areas of the structural layer in the silicon wafer;

depositing a non-oxidizable mask layer in the first, the second and the third areas of the structural layer;

removing the silicon dioxide pad layer and the non-oxidizable mask layer from the first area and the second area of the structural layer;

consuming the structural layer in an initial LOCOS oxidation process step to form an initial LOCOS oxide layer in the first area and the second area of the structural layer;

removing the initial LOCOS oxide layer from the first area of the structural layer to form a silicon dioxide pattern from the initial LOCOS oxide layer in the second area of the structural layer, such that the structural layer includes a bump structure in the second area having a smaller recess depth than a recess depth in the first area of the structural layer; and consuming the structural layer in at least one main LOCOS oxidation process step to form a main LOCOS oxide layer in the first area and the second area of the structural layer.

2. The method for manufacturing according to claim 1, further comprising removing the silicon dioxide pad layer, the mask layer and the LOCOS oxide layer from the structural layer to expose the first area and the second area of the structural layer.

3. The method for manufacturing according to claim 2, wherein the first area, the second area and the third area of the structural layer are on a horizontal face of the silicon wafer.

4. The method for manufacturing according to claim 3, wherein the third area of the structural layer is level with the horizontal face of the wafer, and the first and the second area are recessed in a vertical direction from the horizontal face of the wafer.

5. The method for manufacturing according to claim 4, wherein the vertical direction is perpendicular to the horizontal face of the wafer.

6. The method for manufacturing according to claim 5, further comprising:

etching the first area to a first recess depth in relation to the horizontal face of the wafer; and etching the second area to a second recess depth in relation to the horizontal face of the wafer, with the first recess depth being greater than the second recess depth.

7. The method for manufacturing according to claim 1, wherein the removing of the silicon dioxide pad layer comprises wet etching the silicon dioxide pad layer so that only the third area is protected from recession by the non-oxidizable mask layer deposited over the silicon dioxide pad layer.

\* \* \* \* \*